United States Patent
Wang

(10) Patent No.: US 11,085,958 B2
(45) Date of Patent: Aug. 10, 2021

(54) ANTENNA TESTING MODULE AND METHOD FOR OPERATING THE SAME

(71) Applicant: ASE TEST, INC., Kaohsiung (TW)

(72) Inventor: Yen-Chun Wang, Kaohsiung (TW)

(73) Assignee: ASE TEST, INC., Kaohsiung (TW)

( * ) Notice: Subject to any disclaimer, the term of this patent is extended or adjusted under 35 U.S.C. 154(b) by 0 days.

(21) Appl. No.: 16/435,384

(22) Filed: Jun. 7, 2019

(65) Prior Publication Data

US 2020/0386802 A1 Dec. 10, 2020

(51) Int. Cl.
*G01R 29/08* (2006.01)
*H04B 17/10* (2015.01)

(52) U.S. Cl.
CPC ....... *G01R 29/0871* (2013.01); *H04B 17/102* (2015.01)

(58) Field of Classification Search
CPC .................................................... H04B 17/102
See application file for complete search history.

(56) References Cited

U.S. PATENT DOCUMENTS

| | | | |
|---|---|---|---|
| 9,882,276 B1* | 1/2018 | Hall | H01Q 3/02 |
| 10,276,933 B1* | 4/2019 | Chukka | H01Q 1/246 |
| 2010/0045543 A1* | 2/2010 | Kitada | G01R 29/105 |
| | | | 343/703 |
| 2015/0011273 A1* | 1/2015 | Wilmhoff | G06F 3/048 |
| | | | 455/575.7 |

FOREIGN PATENT DOCUMENTS

TW I463820 B 12/2014

* cited by examiner

*Primary Examiner* — Hsinchun Liao
(74) *Attorney, Agent, or Firm* — Foley & Lardner LLP

(57) ABSTRACT

An antenna testing module includes a box, a platform within the box, and a detection module at least partially within the box. The box is configured to accommodate a device under test (DUT). The platform is configured to hold the DUT. The detection module is configured to receive an electromagnetic radiation emitted from the DUT and to locate an antenna phase center of the DUT.

21 Claims, 9 Drawing Sheets

ANTENNA TESTING MODULE AND METHOD FOR OPERATING THE SAME

BACKGROUND

1. Field of the Disclosure

The present disclosure relates to an antenna testing module and a method for testing a device under test (DUT).

2. Description of the Related Art

A wireless module (e.g., an mmWave RF wireless module) may be tested over the air (OTA). Such testing may be performed in a testing room, in which a plurality of absorbers are disposed (e.g. on inner surfaces thereof). Such a testing room can be large (e.g., 10 meters (m)*10 m*10 m), and the cost for building the testing room is expensive, which will increase the cost for testing a wireless module. In addition, such testing may take a long time. Therefore, this may be unsuitable for testing devices as part of a mass production process.

SUMMARY

According to one aspect, in some embodiments, an antenna testing module includes a box, a platform within the box, and a detection module at least partially within the box. The box is configured to accommodate a device under test (DUT). The platform is configured to hold the DUT. The detection module is configured to receive an electromagnetic radiation emitted from the DUT and to locate an antenna phase center of the DUT.

According to one aspect, in some embodiments, an antenna testing module includes a platform, a detection module, an actuator, and a box to accommodate the platform and the DUT. The platform is configured to hold the DUT. The detection module is configured to receive an electromagnetic radiation emitted from the DUT. The actuator is configured to move the detection module by a polar angle ($\theta$) and an azimuth angle ($\varphi$) in a spherical coordinate system.

According to one aspect, in some embodiments, a method for testing a DUT includes placing the DUT within a box, and detecting electromagnetic waves emitted from the DUT by a detection module. The method further includes changing a relative position of the DUT with regard to the detection module to obtain an electromagnetic wave having a maximum power. The method further includes determining an antenna phase center of the DUT based on a position of the electromagnetic wave having the maximum power.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
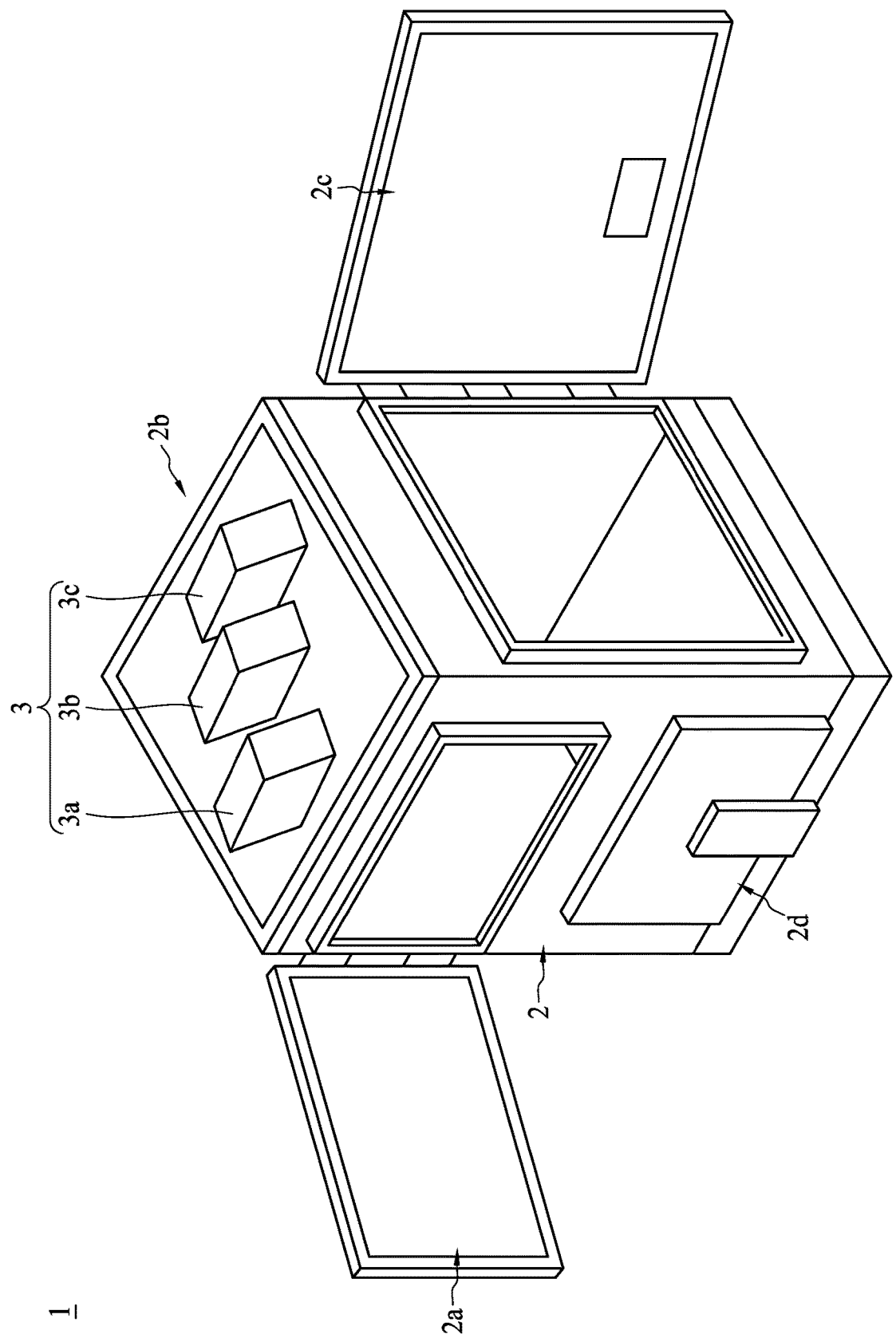
FIG. 1A illustrates a perspective view of an antenna testing module according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

A directional antenna device or a beam antenna device may radiate or receive antenna having greater power in specific directions, and the direction having a maximum power corresponds to an antenna phase center of the device. For example, the directional antenna may include a radio frequency (RF) antenna with a frequency of 25 GHz to 80 GHz; or an antenna (such as an antenna array) treated (such as by a beam forming technique) to have a greater concentration of radiation in a certain direction.

Figure 1B:
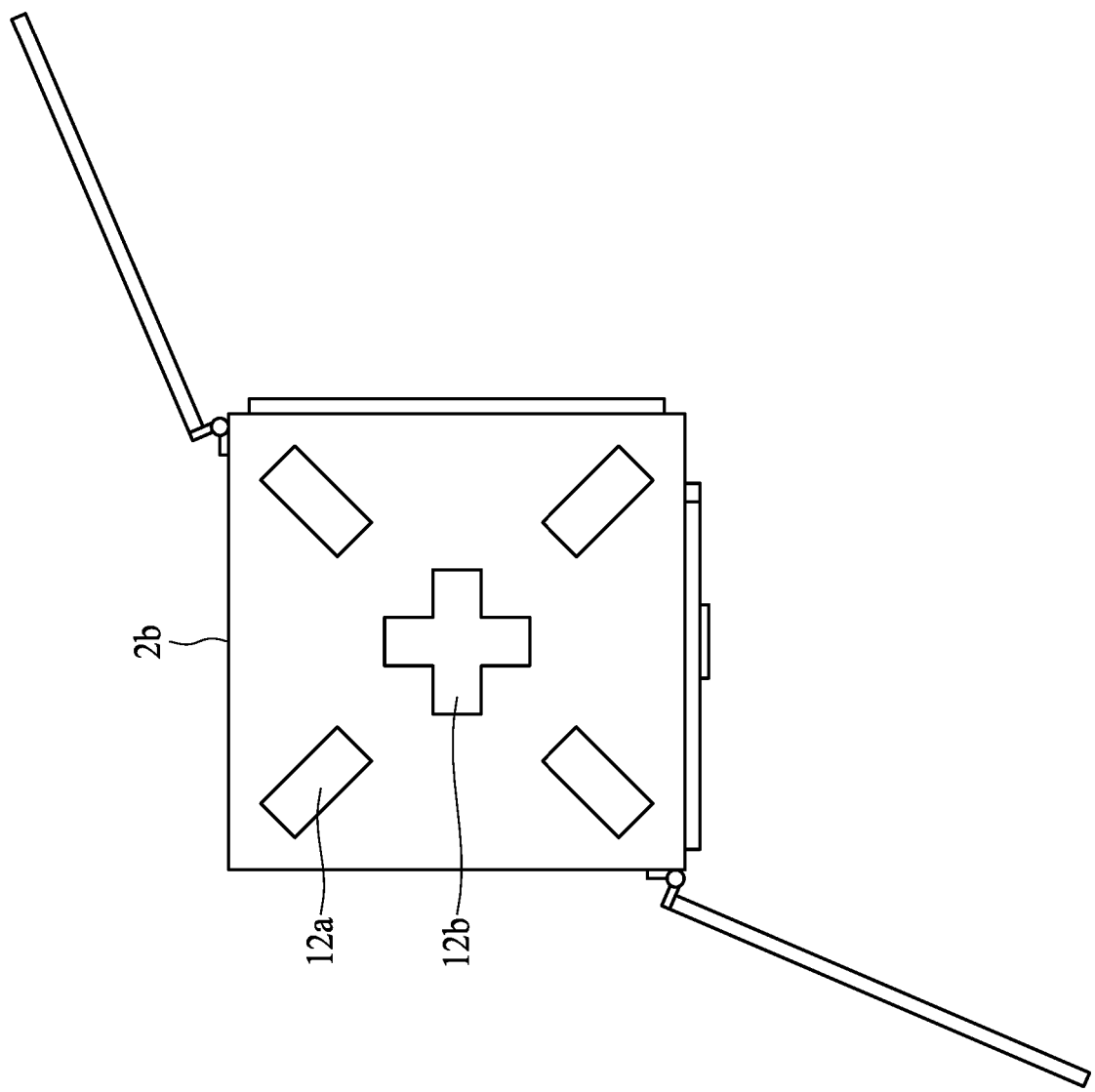
FIG. 1B illustrates a top view of the antenna testing module in FIG. 1A according to some embodiments of the present disclosure.
Figure 2:
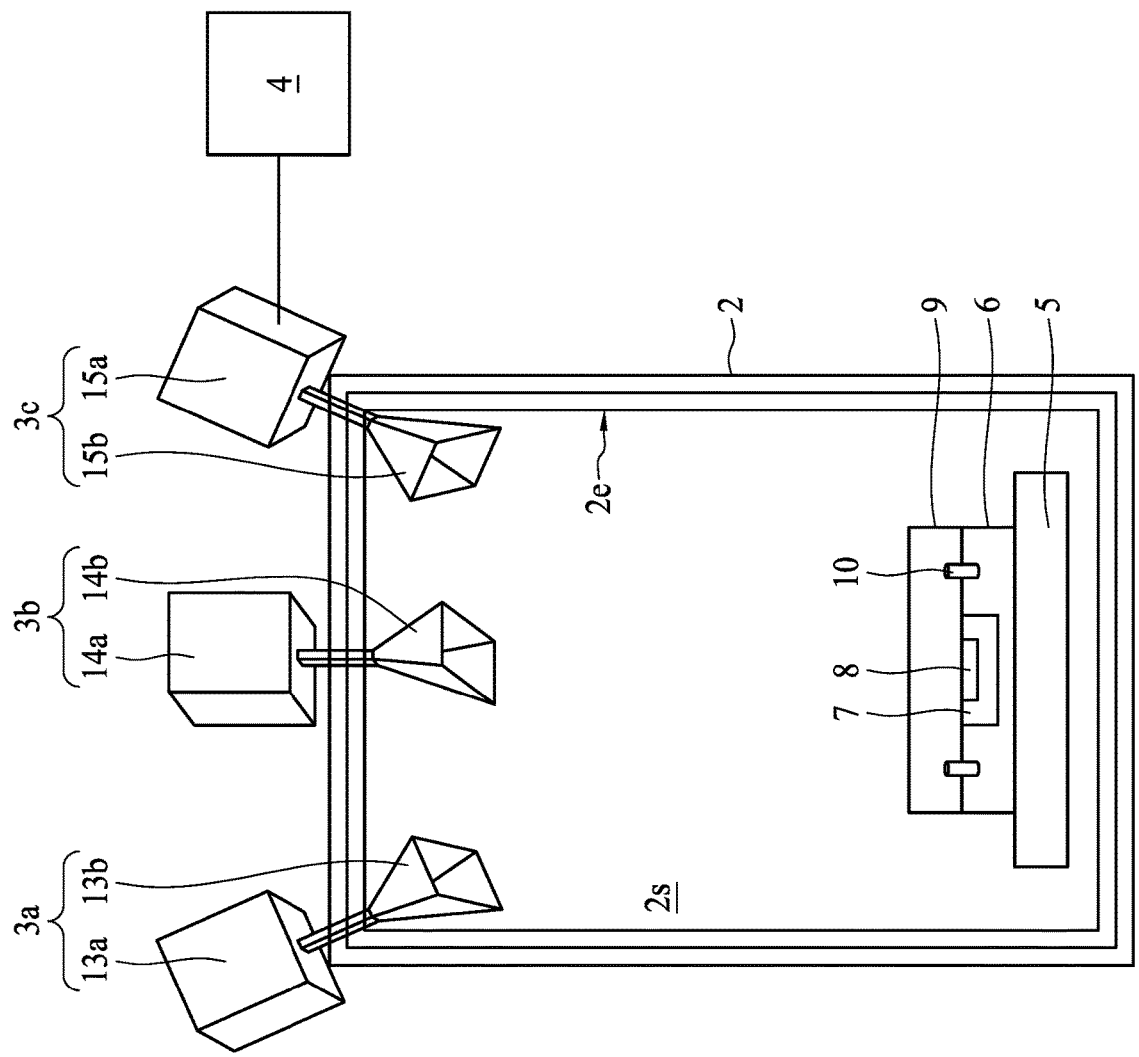
FIG. 2 illustrates a cross-sectional view of the antenna testing module in FIG. 1A according to some embodiments of the present disclosure.

FIG. 1A illustrates a perspective view of an antenna testing module 1 according to some embodiments of the present disclosure. FIG. 1B illustrates a top view of the antenna testing module in FIG. 1A according to some embodiments of the present disclosure. FIG. 2 illustrates a cross-sectional view of the antenna testing module 1 according to some embodiments of the present disclosure. The antenna testing module 1 includes a box 2, a detection module 3, a platform 5 and a processing unit 4.

As shown in FIG. 2, the box 2 defines a space 2s to accommodate the platform 5 and a device under test (DUT) 7. In some embodiments, the DUT 7 may include an electronic component and at least one antenna. For example, the DUT 7 may include an antenna in package (AiP). For example, the DUT 7 may be a wireless module such as an mmWave wireless module. In one embodiment, the DUT 7 may be a radio frequency (RF) AiP with a frequency of 25 GHz to 80 GHz or 30 GHz to 80 GHz. In some embodiments, the box 2 may be an anechoic box, a shielding box, or other box isolating the space 2s from the outside environment.

The box 2 includes a top wall 2b, side walls, and a bottom wall. In some embodiments, the top wall 2b, the side walls and the bottom wall are separate walls that are assembled together by, for example, screws. In some embodiments, the top wall 2b, the side walls and the bottom wall may be formed integrally as a monolithic structure.

In some embodiments, as shown in FIG. 1B, the top wall 2b may define several tracks or slots 12a and 12b for the movements of the detection module 3. In some embodiments, the tracks or slots 12a and 12b may include several kinds of shapes, such as a rectangle shape, a cross shape, etc. The detection module 3 may be movable along the tracks or slots 12a and 12b. In some embodiments, the number of the shape of the tracks or slots 12a and 12b can be changed depending on different design specifications. In some embodiments, the number of the tracks or slots 12a and 12b is equal to or greater than 3.

In some embodiments, one or more windows or doors 2a, 2c, and 2d may be disposed on one or more side walls for transporting, accessing and arranging the DUT 7. For example, the door 2d is arranged to allow the DUT 7 to transport into the box 2 or out of the box 2. For example, the doors 2a and 2c are arranged to allow a user to check the DUT 7 within the box 2. In some embodiments, the number of the doors can be adjusted or changed depending on different design specifications.

In some embodiments, an absorber 2e may be disposed on the inner surfaces of the top wall, the side walls, and the bottom wall of the box 2. The absorber 2e may be an electromagnetic wave or radiation absorbing material (such as polymer with metal particles dispersed therein). In some embodiments, the absorber 2e is attached on the inner surfaces of the box 2 by, for example, adhesion. In some embodiments, the absorber 2e may be formed on the inner surface of the box 2 by, for example, coating. The absorber 2e may absorb the electromagnetic wave having a frequency of 25 GHz to 80 GHz.

The detection module 3 may include one or more detection components 3a, 3b and 3c. Each of the detection components 3a, 3b and 3c may include a control portion and a detection portion. For example, the detection component 3a include a control portion 13a and a detection portion 13b. For example, the detection component 3b include a control portion 14a and a detection portion 14b. For example, the detection component 3c include a control portion 15a and a detection portion 15b.

A portion of the detection components 3a, 3b and 3c (e.g., the detection portions 13b, 14b, and 15b) is disposed within the box 2, and configured to receive electromagnetic radiations from the DUT 7 and/or to transmit electromagnetic radiations to the DUT 7. For example, the detection components 3a, 3b and 3c are configured to detect the powers and the electromagnetic spectrum (or electromagnetic field) of the electromagnetic radiations emitted from the DUT 7. Each of the detection components 3a, 3b and 3c may include an emitter, a receiver, or an emitter-receiver pair. In some embodiment, the detection components 3a, 3b and 3c are radio units or antenna types. For example, the detection portions 13b, 14b, and 15b are antennas (e.g., horn antennas).

In some embodiments, each of the control portions 13a, 14a, and 15a may include an actuator permitting each of the detection components 3a, 3b and 3c to move in a plurality of directions. In some embodiments, the actuators permit each of the detection components 3a, 3b and 3c to move along a direction defined by a polar angle ($\theta$) and an azimuth angle ($\varphi$) in a spherical coordinate system, such as shown in the schematic perspective view in FIG. 3. In some embodiments, each of the control portions 13a, 14a, and 15a may include an actuator permitting each of the detection components 3a, 3b and 3c to move along their respective tracks or slots 12a and 12b.

In some embodiments, each of the control portions 13a, 14a, and 15a may include a processing unit and a memory for receiving, processing, and storing the information of the electromagnetic radiations emitted from the DUT 7.

Since each of the detection components 3a, 3b and 3c can move in a polar angle ($\theta$) and an azimuth angle ($\varphi$), and move along their own tracks or slots 12a and 12b, the detection components 3a, 3b and 3c can scan the entire directions of electromagnetic radiations or waves emitted from the DUT 7, which can reduce the number of the detection components for detecting the electromagnetic radiations emitted from the DUT 7 and in turn reduce the size of the antenna testing module 1. In some embodiments, a size of the box 2 has a length, width and height between about 30 cm to about 100 cm, (e.g., between about 40 cm to about 90 cm, or between about 50 cm to about 80 cm). In some embodiments, the size of the box 2 may be big enough for the electromagnetic radiations to be transmitted between the detection module 3 and the DUT 7, taking into consideration the far field of the electromagnetic radiation.

With regard to the number of the detection component, it should be understood that although three detection components 3a, 3b and 3c are illustrated in FIG. 1 and FIG. 2, the detection module 3 may include any number of the detection components depending on design specifications.

Still referring to FIGS. 1 and 2, the processing unit 4 of the antenna testing module 1 connects to each of the detection components 3a, 3b and 3c. The processing unit 4 is configured to process or calculate signal received by the detection module 3. In some embodiments, the processing unit 4 is configured to retrieve information or parameters (e.g., power, spectrum, patterns, distribution, frequency, gain and the like) of the electromagnetic radiations received from the DUT 7. In some embodiments, the processing unit 4 is configured to locate one of the electromagnetic radiations received by the detection module 3 that has a maximum power, and to determine the position on the DUT 7 corresponding to the location of the electromagnetic radiation having the maximum power. In some embodiments, the position on the DUT 7 vertically under the location of the electromagnetic radiation having the maximum power is determined as an antenna phase center of the DUT 7.

In some embodiments, in addition to dynamically processing the one or more electromagnetic radiation parameters or information, the processing unit 4 further generates real time or in-situ radiation information sequentially or synchronously. In some embodiments, the real time radiation information may include a radiation pattern. In some embodiments, the real time radiation information may be outputted as a function of the location over the DUT 7. For examples, the radiation information may include a radiation pattern as a function of the location over the DUT 7. In some embodiments, the processing unit 4 may include a processor. In some embodiments, the processing unit 4 may be incorporated or integrated into the detection module 3.

Still referring to FIGS. 1 and 2, in operation, the platform 5 is configured to receive or support the DUT 7. For example, as shown in FIG. 2, the DUT 7 is held between a holder 6 and a cap 9, and is received on the platform 5 in the space 2s. In some embodiments, one or more connectors 10, such as bolts, screws, sticks, or other types of connectors are provided between the holder 6 and the cap 9 to hold the DUT 7 tighter.

In some embodiments, the holder 6 includes a thermal conductive material, such as, for examples, a purely metallic conductive material, a metal alloy, a composite material, or other material that exhibits an acceptable thermal conductivity.

In some embodiments, since the electromagnetic radiation emitted from the DUT 7 would be transmitted through the cap 9, the cap 9 includes a material having a less impact on the electromagnetic radiations. For example, the cap 9 may include a material having a low dielectric constant (Dk) (e.g., from about 1.0 Farad/meter (F/m) to about 6.0 F/m). In some embodiments, the material of the cap 9 may be, for examples, a plastic, a wood, an acrylic or an aerogel.

Figure 4:
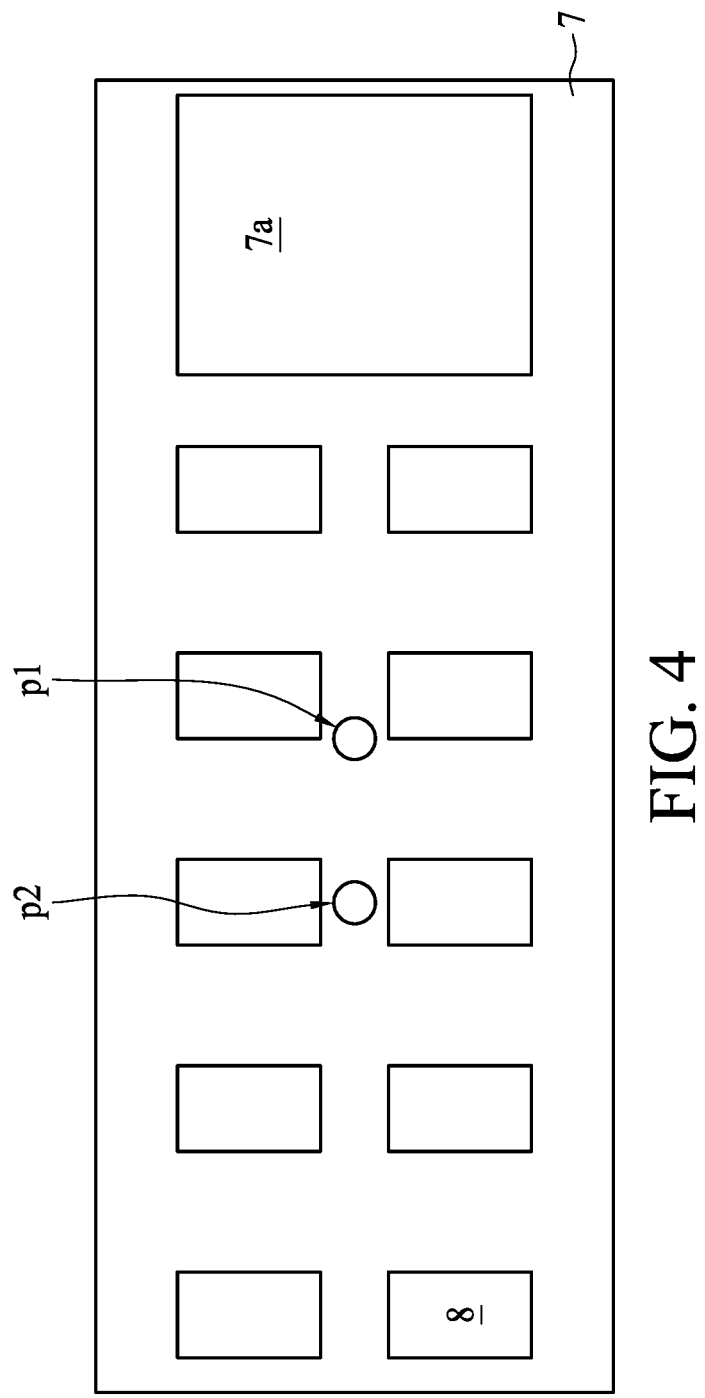
FIG. 4 illustrates a top view of a device under test (DUT) according to some embodiments of the present disclosure.

FIG. 4 illustrates a top view of the DUT 7 in accordance with some embodiments of the present disclosure. The DUT 7 may include a substrate (not denoted in FIG. 4), an encapsulant (not denoted in FIG. 4), an array of the radiation sources or receivers 8 (e.g., antenna array), and an electrical element 7a. In some embodiments, the DUT 7 may be electrically connected to an instrument or a device, which may control the activation of the radiation sources or receivers 8. As shown in FIG. 4, the array of the radiation sources or receivers 8 is close to one side of the DUT 7 while the electrical element 7a is close to an opposite side of the DUT 7. In some embodiments, the DUT 7 may have the array of the radiation sources or receivers 8 on one side, and have another array of the radiation sources or receivers 8 on the other side. In some embodiments, as shown in FIG. 4, the antenna phase center p2 of the DUT 7 is not on the same position as the geometric center p1 of the DUT 7. The antenna phase center p2 of the DUT 7 is vertically corresponds to the position of the electromagnetic wave having the maximum power.

It should be understood that the DUT 7 as illustrated is just one kind of object that can be tested or inspected with the antenna testing module 1. In some embodiments of the present disclosure, in addition to the DUT 7, another kind of DUT may be held on the platform 5 to undergo an antenna testing process, the examples of DUT are a semiconductor package with a directional antenna, a semiconductor package with an omnidirectional antenna, etc.

In some embodiments, the platform 5 may be connected to an actuator permitting the platform 5 to move in a plurality of directions. In some embodiments, the actuator permits the platform 5 to move along two perpendicular directions, such as the X and Y directions. For example, as shown in the top view in FIG. 5, the DUT 7 moves in an X-Y plane within the box 2, such that the entire surface of the DUT 7 can be scanned by the detection module 3.

Figure 6:
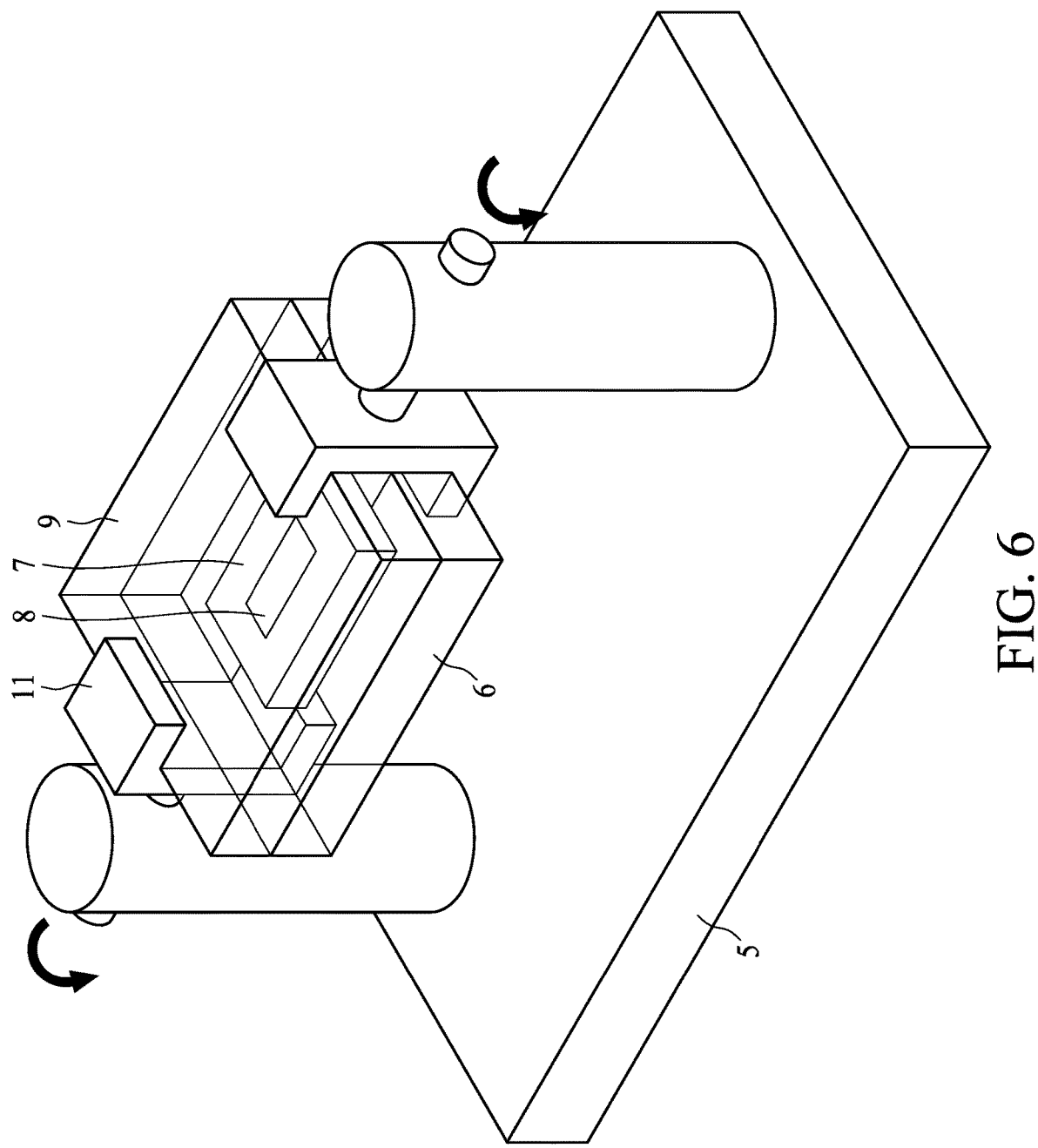
FIG. 6 illustrates a perspective view of a part of an antenna testing module according to some embodiments of the present disclosure.

In some embodiments, as shown in the schematic perspective view in FIG. 6, the platform 5 may has a clamping component 11 to clamp the holder 6 and the cap 9 and to rotate the DUT 7 held between the holder and the cap 9 from 0 degree to 180 degrees (e.g., to move upside-down), which allows the detection module 3 to scan electromagnetic radiations emitted from both surfaces of the DUT 7.

Figure 7A:
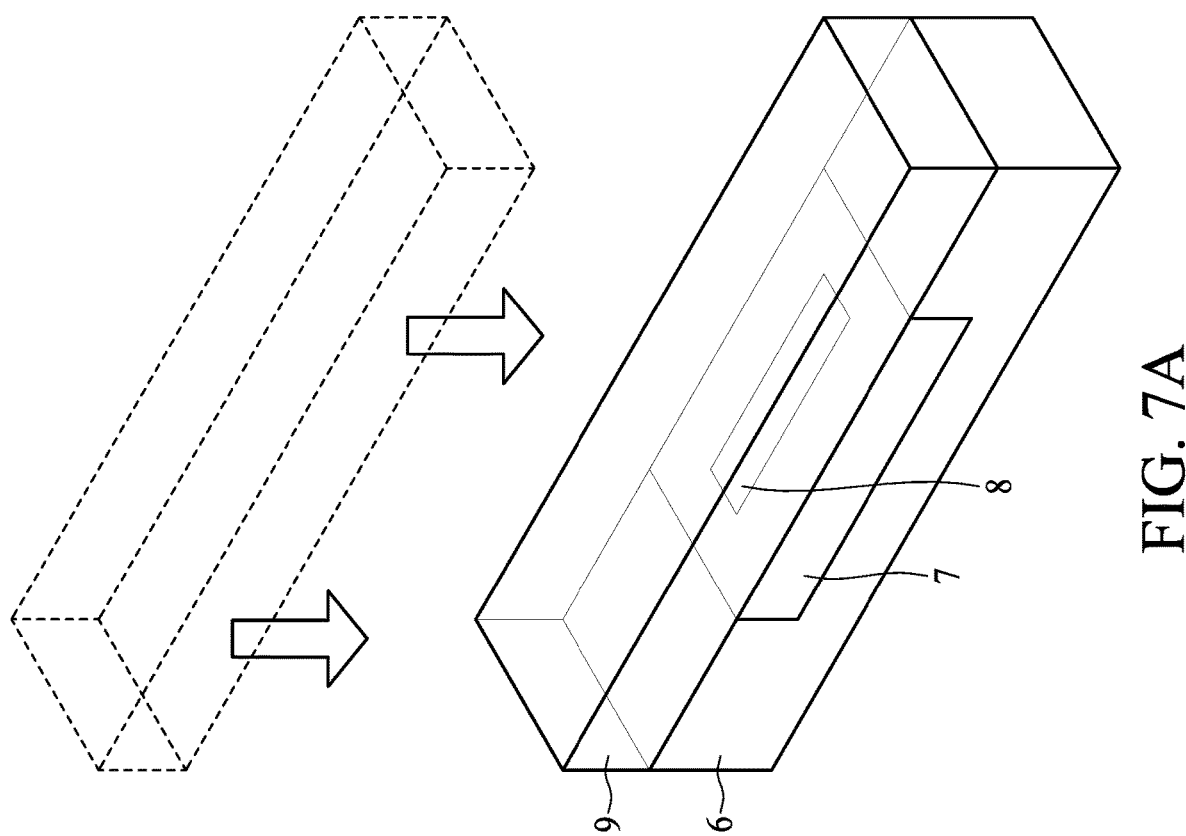
FIG. 7A illustrates a perspective view of a DUT within a cap and a holder according to some embodiments of the present disclosure.
Figure 7B:
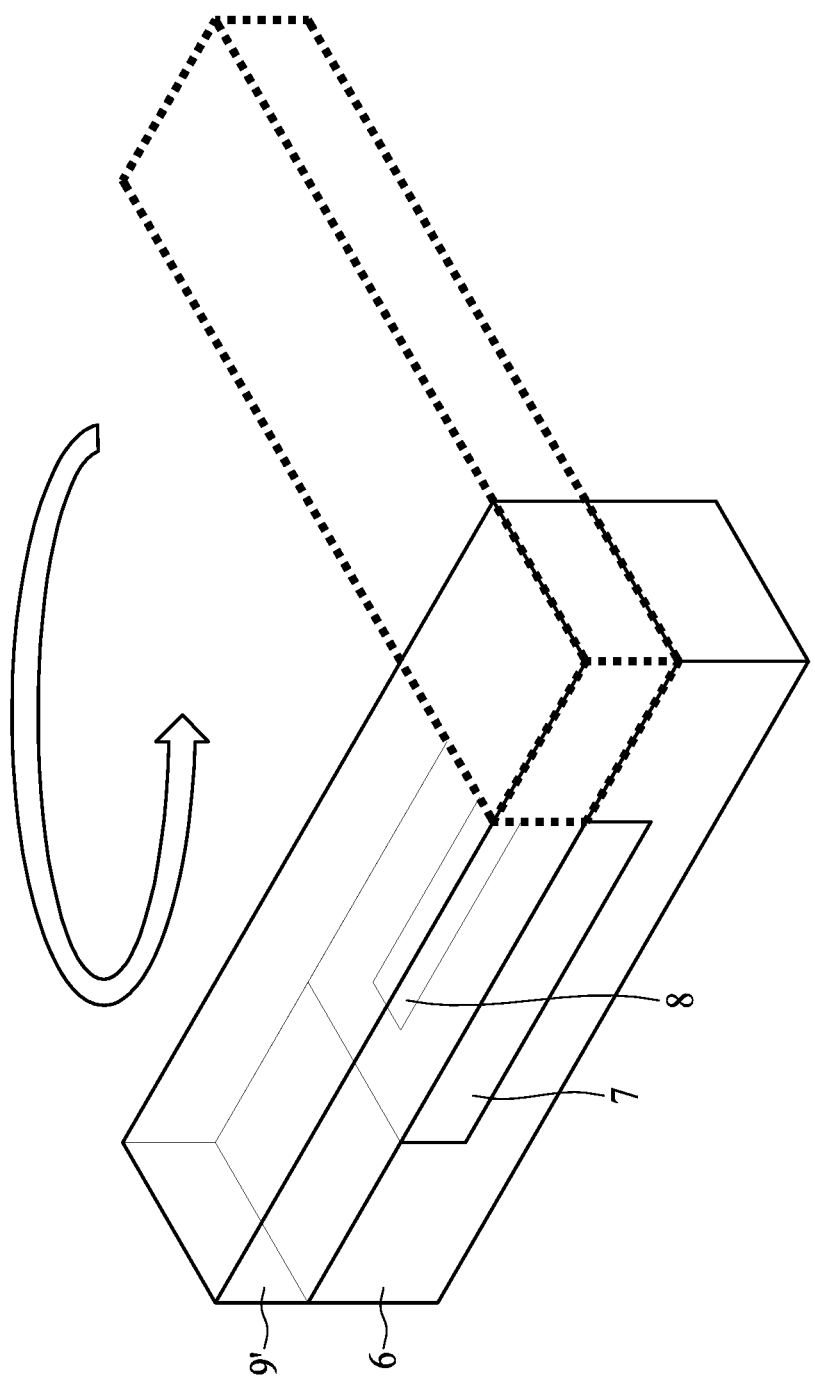
FIG. 7B illustrates a perspective view of a DUT within a cap and a holder according to some embodiments of the present disclosure.

FIG. 7A illustrates a perspective view of the cap 9 and the holder 6 according to some embodiments of the present disclosure. FIG. 7B illustrates a perspective view of a cap 9' and the holder 6 according to some embodiments of the present disclosure.

As shown in FIG. 7A, the cap 9 may press down on the holder 6 from above to cover or enclose the DUT 7 and the radiation sources or receivers 8. The arrangement of the cap 9 and the holder 6 can be set depending on design specifications, and the present disclosure is not limited thereto. For example, the cap 9' and the holder 6 in FIG. 7B are similar to those shown in FIG. 7A, except that the cap 9' in FIG. 7B can rotate with respect to the holder 6. As shown in FIG. 7B, the cap 9' may rotate around an axis to press down on the holder 6, and cover or enclose the DUT 7 and the radiation sources or receivers 8.

In some embodiments, a method for operating the antenna testing module 1 in FIG. 1 may include the following operations: placing the DUT 7 within the box 2, detecting electromagnetic waves emitted from the DUT 7 by the detection module 3, and determining the antenna phase center of the DUT 7.

For example, the DUT 7 is placed on the holder 6 and covered by the cap 9. The holder 6, the DUT 7 and the cap 9 may be placed on the platform 5. The DUT 7 is isolated from the outside environment by the box 2. Then, the radiation sources or receivers 8 of the DUT 7 may be turned on or activated to interact with the detection module 3, such as receiving electromagnetic waves from the detection module 3 or emitting electromagnetic waves to the detection module 3. In some embodiments, the information (e.g., power, spectrum, patterns, distribution, frequency, gain and the like) of the electromagnetic waves emitted from the DUT 7 to the detection module 3 may be recorded or stored.

Figure 3:
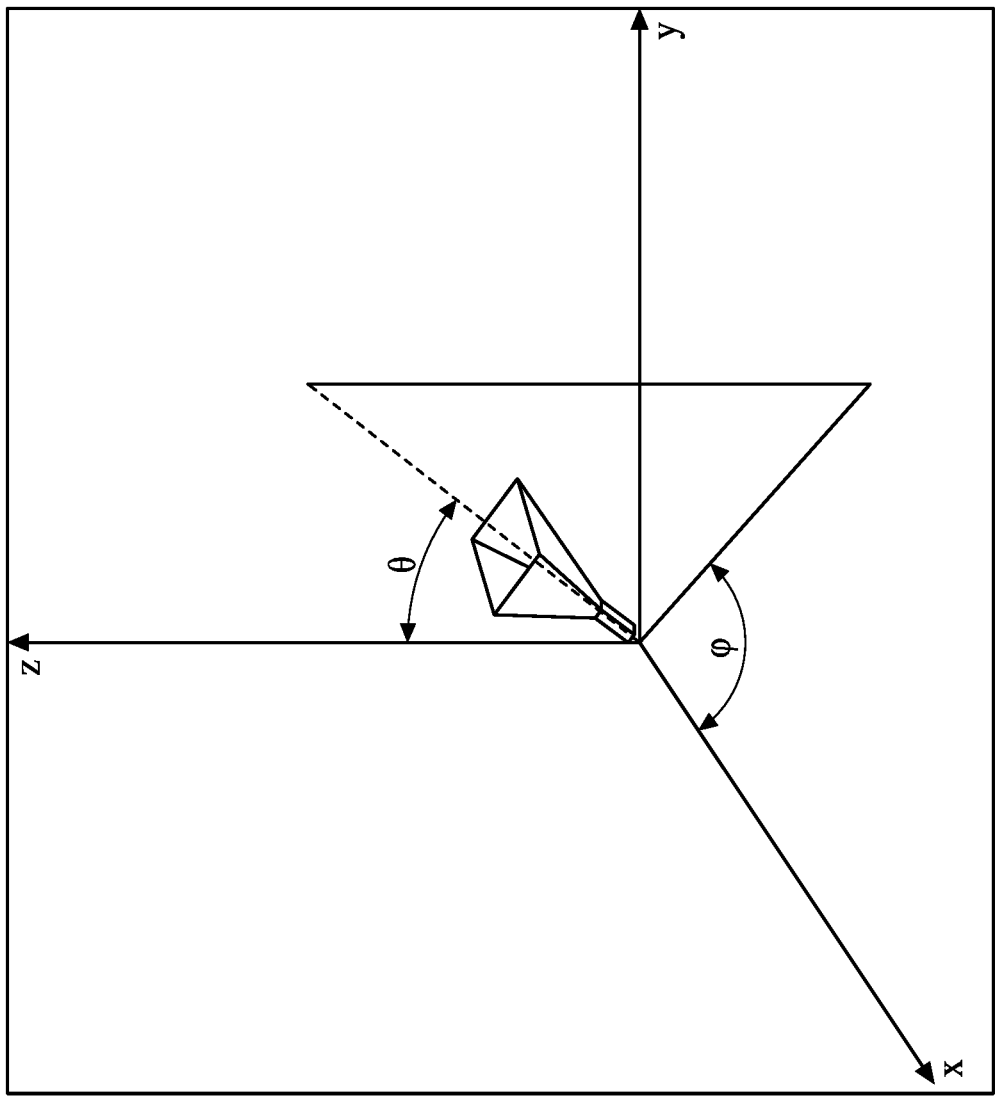
FIG. 3 illustrates a perspective view of a detection module in a spherical coordinate system according to some embodiments of the present disclosure.
Figure 5:
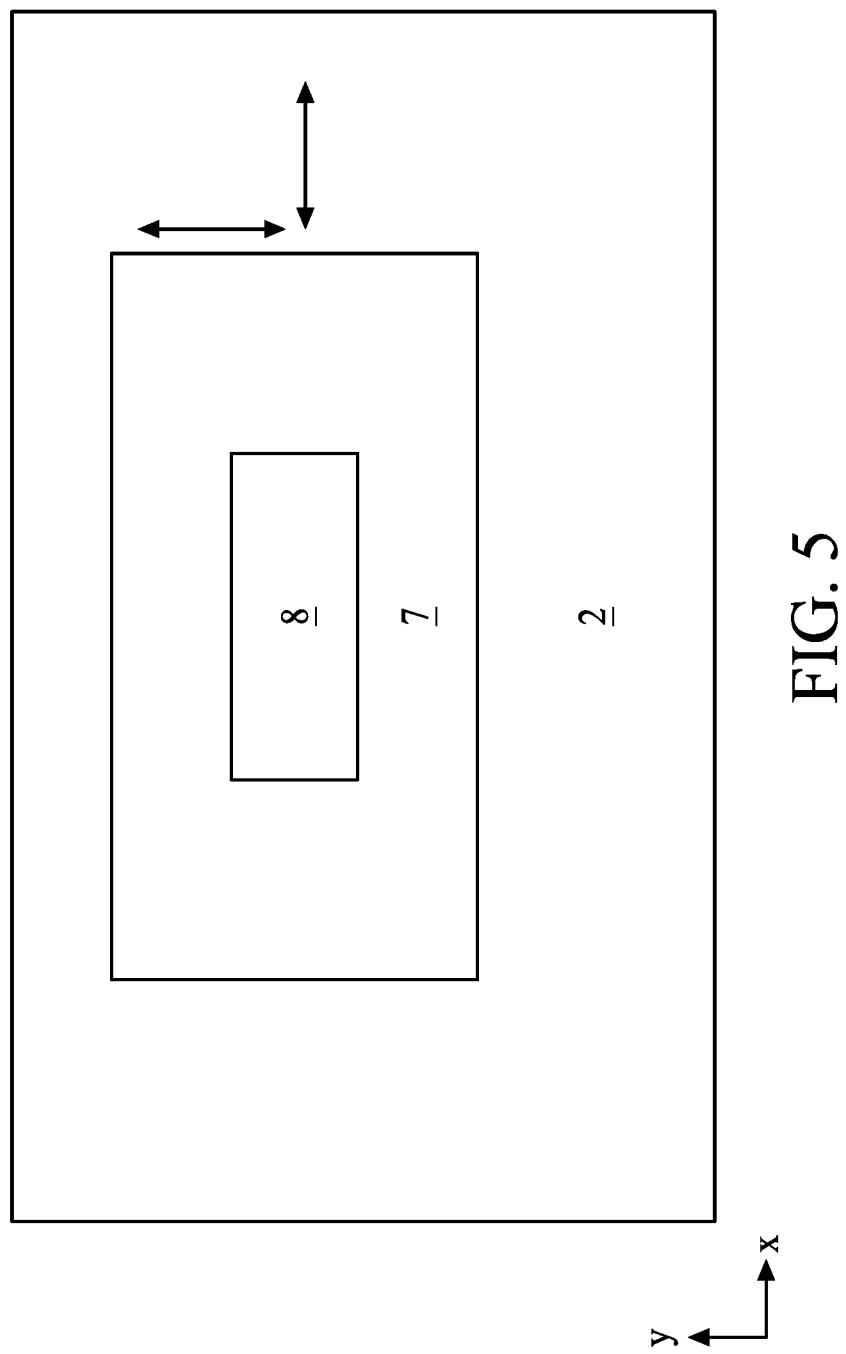
FIG. 5 illustrates a top view of a DUT according to some embodiments of the present disclosure.

The operation further includes changing a relative position of the DUT 7 with regard to the detection module 3 to obtain, detect, locate or inspect the electromagnetic wave having the maximum power. For examples, the DUT 7 and the detection module 3 can be moved or rotated as illustrated in FIGS. 3, 5, and 6.

In some embodiments, the platform 5 may move by a certain number of steps in the X-Y plane to obtain, detect, locate or inspect the electromagnetic wave having the maximum power. In some embodiments, the detection module 3 moves along a direction defined by a polar angle ($\theta$) and a azimuth angle ($\varphi$) in a spherical coordinate system to obtain, detect, locate or inspect the electromagnetic wave having the maximum power. In some embodiments, the platform 5 moves in the X-Y plane while the detection module 3 move along a direction defined by a polar angle ($\theta$) and a azimuth angle ($\varphi$) in a spherical coordinate system.

The operation further includes determining an antenna phase center of the DUT 7. The antenna phase center of the DUT 7 is vertically below the position of the electromagnetic wave having the maximum power. In some embodiments, the antenna phase center over the surface of the DUT 7 can be computed or defined based on the obtained results.

The operation further includes generating a radiation pattern based on the electromagnetic radiations detected from the DUT 7. For examples, as mentioned above, the real time radiation information may be outputted as a function of the location over the DUT 7.

In some embodiments, after obtaining the electromagnetic radiation having the maximum power, the detection module 3 may move with respect to the electromagnetic radiation having the maximum power to detect or inspect the phase shape of the maximum power. For example, the detection module 3 may move along a direction defined by a polar angle (θ) and a azimuth angle (φ) in a spherical coordinate system.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As sued herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent construction does not depart from the spirit and scope of the present disclosure, and various changes, substitutions, and alterations may be made without departing from the spirit and scope of the present disclosure.

What is claimed is:

1. An antenna testing module, comprising:
   a box configured to accommodate a device under test (DUT);
   a platform within the box and configured to hold the DUT; and
   a plurality of separate detection modules at least partially within the box, and configured to receive an electromagnetic radiation emitted from the DUT and to determine an antenna phase center of the DUT,
   wherein one of the plurality of separate detection modules further comprises:
   an antenna configured to receive the electromagnetic radiation; and
   an actuator connected to the antenna and configured to control the antenna to move in a plurality of directions.

2. The antenna testing module as claimed in claim 1, wherein the plurality of directions include a direction defined by a polar angle (θ) and an azimuth angle (φ) in a spherical coordinate system.

3. The antenna testing module as claimed in claim 1, wherein the plurality of separate detection modules are configured to locate a position of the electromagnetic radiation having a maximum power.

4. The antenna testing module as claimed in claim 1, wherein the platform is further configured to at least one of:
   turn the DUT to upside-down; and
   move the DUT in at least two perpendicular directions.

5. The antenna testing module as claimed in claim 1, further comprising:
   a processing unit connected to the plurality of separate detection modules and configured to process the electromagnetic radiation and generate a radiation pattern of the DUT based on the electromagnetic radiation.

6. The antenna testing module as claimed in claim 1, wherein the platform comprises:
   a holder configured to contain the DUT; and
   a cap configured to cover the DUT.

7. The antenna testing module as claimed in claim 1, wherein each of the plurality of separate detection modules is oriented at different angles relative to the DUT.

8. The antenna testing module as claimed in claim 1, wherein each of the plurality of separate detection modules comprises an antenna oriented at different angles relative to the DUT.

9. An antenna testing module, comprising:
   a platform configured to hold a device under test (DUT); and
   plurality of separate detection modules configured to receive an electromagnetic radiation emitted from the DUT;
   an actuator configured to move one of the plurality of separate detection modules by a polar angle (θ) and an azimuth angle (φ) in a spherical coordinate system with respect to the DUT; and
   a box to accommodate the platform and the DUT.

10. The antenna testing module as claimed in claim 9, further comprising:
    a wave absorber aligning one or more walls of the box.

11. The antenna testing module as claimed in claim 9, wherein the electromagnetic radiation emitted from the DUT is directional.

12. The antenna testing module as claimed in claim 9, wherein one of the plurality of separate detection modules further comprises an antenna configured to receive the electromagnetic radiation.

13. The antenna testing module as claimed in claim 9, wherein the plurality of separate detection modules are configured to locate a position of the electromagnetic radiation having a maximum power.

14. The antenna testing module as claimed in claim 9, wherein the platform is further configured to at least one of:
    turn the DUT to upside-down; and
    move the DUT in at least two perpendicular directions.

15. The antenna testing module as claimed in claim 9, further comprising:
    a processing unit connected to the plurality of separate detection modules and configured to process the electromagnetic radiation and generate a radiation pattern of the DUT based on the electromagnetic radiation.

16. The antenna testing module as claimed in claim 9, wherein the platform comprises a holder configured to contain the DUT; and a cap configured to cover the DUT.

17. A method for testing a device under test (DUT), comprising:
- (a) detecting electromagnetic waves emitted from the DUT by a plurality of separate detection modules, wherein one of the plurality of separate detection modules comprises an antenna and an actuator connected to the antenna;
- (b) changing a relative position of the DUT with regard to the antenna through the actuator to obtain an electromagnetic wave having a maximum power; and
- (c) determining an antenna phase center of the DUT based on a position of the electromagnetic wave having the maximum power.

18. The method as claimed in claim 17, wherein operation (b) further comprises at least one of:

moving a position of the DUT; and moving a positon of the plurality of separate detection modules.

19. The method as claimed in claim 17, further comprising:

moving the plurality of separate detection modules by a polar angle ($\theta$) or an azimuth angle ($\varphi$) in a spherical coordinate system.

20. The method as claimed in claim 17, wherein the antenna phase center of the DUT is vertically below the position of the electromagnetic wave having the maximum power.

21. The method as claimed in claim 17, further comprising generating a radiation pattern based on the electromagnetic waves detected from the DUT.

* * * * *